United States Patent
Takeuchi et al.

(10) Patent No.: US 9,929,719 B2
(45) Date of Patent: Mar. 27, 2018

(54) HIGH-FREQUENCY MODULE

(71) Applicant: Murata Manufacturing Co., Ltd., Nagaokakyo-shi, Kyoto-fu (JP)

(72) Inventors: Morio Takeuchi, Nagaokakyo (JP); Hideki Muto, Nagaokakyo (JP); Masanori Kato, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 142 days.

(21) Appl. No.: 15/016,872

(22) Filed: Feb. 5, 2016

(65) Prior Publication Data
US 2016/0156329 A1 Jun. 2, 2016

Related U.S. Application Data

(63) Continuation of application No. PCT/JP2014/066227, filed on Jun. 19, 2014.

(30) Foreign Application Priority Data

Aug. 6, 2013 (JP) .................................. 2013-163266
Oct. 30, 2013 (JP) .................................. 2013-225096

(51) Int. Cl.
*H03H 9/72* (2006.01)
*H03H 9/60* (2006.01)
(Continued)

(52) U.S. Cl.
CPC .......... *H03H 9/725* (2013.01); *H03H 9/0009* (2013.01); *H03H 9/0542* (2013.01);
(Continued)

(58) Field of Classification Search
CPC ...... H03H 9/0009; H03H 9/1042; H03H 9/64; H03H 9/6433; H03H 9/6483; H03H 9/725; H03H 9/0061; H03H 9/52; H03H 9/605
(Continued)

(56) References Cited

U.S. PATENT DOCUMENTS 7,583,161 B2 * 9/2009 Tanaka ................. H03H 9/0576
333/133
7,619,491 B2 11/2009 Takata et al.
(Continued)

FOREIGN PATENT DOCUMENTS

CN 101467349 A 6/2009
CN 102035522 A 4/2011
(Continued)

OTHER PUBLICATIONS

Official Communication issued in International Application PCT/JP2014/066227, dated Aug. 19, 2014.

*Primary Examiner* — Robert J Pascal
*Assistant Examiner* — Jorge Salazar, Jr.
(74) *Attorney, Agent, or Firm* — Keating & Bennett, LLP

(57) ABSTRACT

A high-frequency module includes a connection line that interconnects a first SAW resonator and a second SAW resonator, and is connected to a second shunt connection terminal through a third SAW resonator. A connection line interconnecting a fourth SAW resonator and a second series connection terminal is connected to the second shunt connection terminal through a fifth SAW resonator. The second shunt connection terminal is connected to a ground through an inductor. A matching circuit is connected between a first series connection terminal and a first external connection terminal. The matching circuit is inductively or capacitively coupled to the inductor.

12 Claims, 9 Drawing Sheets

(51) Int. Cl.
*H03H 9/52* (2006.01)
*H03H 9/05* (2006.01)
*H03H 9/64* (2006.01)
*H03H 9/00* (2006.01)

(52) U.S. Cl.
CPC ............ *H03H 9/0566* (2013.01); *H03H 9/52* (2013.01); *H03H 9/605* (2013.01); *H03H 9/6406* (2013.01); *H03H 9/6483* (2013.01)

(58) Field of Classification Search
USPC .................... 333/133, 187, 188, 193–196
See application file for complete search history.

(56) References Cited

U.S. PATENT DOCUMENTS

| | | | |
|---|---|---|---|
| 7,808,935 B2* | 10/2010 | Koga | ................ H01P 1/213 |
| | | | 333/132 |
| 2003/0058066 A1* | 3/2003 | Taniguchi | ............ H03H 9/0557 |
| | | | 333/193 |
| 2009/0058555 A1 | 3/2009 | Takata et al. | |
| 2010/0225418 A1 | 9/2010 | Kawamoto et al. | |
| 2011/0221546 A1* | 9/2011 | Yamaji | ................. H03H 9/1071 |
| | | | 333/193 |
| 2011/0234295 A1 | 9/2011 | Uejima et al. | |
| 2012/0119847 A1 | 5/2012 | Iwaki et al. | |
| 2014/0118084 A1 | 5/2014 | Takemura | |

FOREIGN PATENT DOCUMENTS

| | | |
|---|---|---|
| JP | 2004-80233 A | 3/2004 |
| JP | 2009-290606 A | 12/2009 |
| JP | 2010-192974 A | 9/2010 |
| JP | 2010-239612 A | 10/2010 |
| JP | 2012-109818 A | 6/2012 |
| WO | 2007/145049 A1 | 12/2007 |
| WO | 2011/089746 A1 | 7/2011 |
| WO | 2013/008435 A1 | 1/2013 |

* cited by examiner

HIGH-FREQUENCY MODULE

BACKGROUND OF THE INVENTION

1. Field of the Invention

The present invention relates to a high-frequency module including a plurality of filter elements.

2. Description of the Related Art

A portable device or the like with a wireless communication function includes a filter circuit in order to allow passage of only a high-frequency signal of a desired frequency, and to attenuate a high-frequency signal having a frequency that is different from the desired frequency.

For example, Japanese Unexamined Patent Application Publication No. 2012-109818 discloses a filter circuit including a plurality of SAW (surface acoustic wave) filters. More specifically, the filter circuit of Japanese Unexamined Patent Application Publication No. 2012-109818 includes the plurality of SAW filters connected in series between an input terminal and an output terminal. A SAW filter is further connected between a connection line, which interconnects an adjacent pair of the SAW filters connected in series, and a ground.

In the filter circuit disclosed in Japanese Unexamined Patent Application Publication No. 2012-109818, an inductor or a series circuit of an inductor and a capacitor (called a compensation circuit) is connected in parallel to the series circuit of the SAW filters for the purpose of improving attenuation characteristics outside a passband. Thus, the compensation circuit is adjusted such that a high-frequency signal (one suppression target signal) located outside of the passband and propagating through a circuit section, which is constituted by a group of SAW filters, and the other suppression target signal propagating through the compensation circuit have amplitudes that match each other and phases that are reversed to each other. As a result, both the suppression target signals are canceled out at a connection point between the circuit section constituted by the group of SAW filters and the compensation circuit, and are not output from an output terminal.

In the above-described configuration, however, the compensation circuit, i.e., the inductor or the series circuit of the inductor and the capacitor, has to be provided in addition to the circuit section, which is constituted by the group of SAW filters and which has the main filter function, for the purpose of just improving the attenuation characteristics. Accordingly, the number of constituent elements of the filter circuit increases, and the size of the filter circuit increases. Thus, the above-described related art is not suitable for currently-used portable terminals, etc., which are required to have smaller sizes.

SUMMARY OF THE INVENTION

Preferred embodiments of the present invention provide a high-frequency module including a small-sized filter circuit that has good attenuation characteristics outside a passband.

Preferred embodiments of the present invention relate to a high-frequency module including a first external connection terminal, a second external connection terminal, a filter unit connected between the first external connection terminal and the second external connection terminal, a matching circuit connected between at least one of the first external connection terminal and the second external connection terminal and the filter unit, and an inductor connected between a ground and the filter unit. A high-frequency module according to a preferred embodiment of the present invention preferably has the following features.

The filter unit includes a first series connection terminal connected to the first external connection terminal, a second series connection terminal connected to the second external connection terminal, and a shunt connection terminal connected to the ground through the inductor. The filter unit further includes a plurality of series-connected filter elements connected in series between the first series connection terminal and the second series connection terminal through a plurality of connection lines. The filter unit further includes a first shunt-connected filter element having one end connected to a first connection line that defines the connection lines, and an opposite end connected to the shunt connection terminal. The filter unit further includes a second shunt-connected filter element having one end connected to a second connection line that defines the connection lines, and an opposite end connected to the shunt connection terminal to which the first shunt-connected filter element is connected. The inductor and the matching circuit are inductively or capacitively coupled to each other.

With the features described above, there are provided not only a main propagation path in which a high-frequency signal propagates through the plurality of filter elements, but also an auxiliary propagation path, i.e., a path including inductive or capacitive coupling that is generated by the inductor connected between the ground and the filter unit, and by the matching circuit. The auxiliary propagation path exhibits amplitude characteristics and phase characteristics, which are different from those of the main propagation path, depending on a coupling degree of the inductive or capacitive coupling. Accordingly, transfer characteristics of the high-frequency module are able to be adjusted by adjusting the amplitude characteristics and the phase characteristics of the auxiliary propagation path. Thus, it is possible to adjust the transfer characteristics of the high-frequency module, and to improve attenuation characteristics, for example, without separately providing an inductor or a capacitor.

Preferably, a high-frequency module according to a preferred embodiment of the present invention has a structure as follows. The inductor and the matching circuit inductively or capacitively coupled to each other are inductively or capacitively coupled such that impedance outside a passband of the filter unit is changed.

By optionally adjusting a coupling mode and a coupling degree as described in the above feature, characteristics outside of the passband, i.e., attenuation characteristics, are able to be changed without changing characteristics within the passband.

Preferably, a high-frequency module according to a preferred embodiment of the present invention has a structure as follows. The inductor and the matching circuit inductively or capacitively coupled to each other are inductively or capacitively coupled such that a frequency of an attenuation pole outside of the passband of the filter unit is changed.

With this feature, the frequency of the attenuation pole is adjusted as one example of adjusting the attenuation characteristics.

In a high-frequency module according to a preferred embodiment of the present invention, the matching circuit may be a series-connected matching circuit that is connected in series between the first external connection terminal and the first series connection terminal, or that is connected in series between the second external connection terminal and the second series connection terminal.

In a high-frequency module according to a preferred embodiment of the present invention, the matching circuit may be a shunt-connected matching circuit that is connected between the connection line interconnecting the first external connection terminal and the first series connection terminal and the ground, or that is connected between the connection line interconnecting the second external connection terminal and the second series connection terminal and the ground.

The above-described features represent examples of practical connection structures of the matching circuit. By optionally determining one of those connection modes, the above-described adjustment of the attenuation characteristics is also able to be appropriately adjusted while impedance matching between the filter unit and the outside is appropriately established.

A high-frequency module according to a preferred embodiment of the present invention may have a structure as follows. The filter unit includes a third terminal and a second filter unit. The second filter unit is connected between a connection line interconnecting the first series connection terminal and the filter element, which is connected to the first series connection terminal, and the third terminal.

With these features, a combining-branching filter (such as a duplexer) is able to be realized in which the first series connection terminal defines and functions as a common terminal, and the second series connection terminal and the third terminal define and function as separate terminals.

A high-frequency module according to a preferred embodiment of the present invention may have a structure as follows. The high-frequency module further includes a flat plate filter substrate including IDT electrodes defining the filter unit and located on a first principal surface of the filter substrate, a flat plate cover layer opposed to the first principal surface of the filter substrate with a spacing defined therebetween, a connection electrode projecting from the first principal surface and penetrating through the cover layer, and a multilayer substrate including the matching circuit mounted thereto or located therein. The filter substrate is arranged such that the first principal surface faces a mount surface of the multilayer substrate. The filter substrate is connected to the multilayer substrate through the connection electrode.

With these features, the high-frequency module is able to be implemented by the filter unit of a so-called WLP (Wafer Level Package) structure and the multilayer substrate. As a result, the size of the high-frequency module is able to be significantly reduced.

A high-frequency module according to a preferred embodiment of the present invention may have a structure as follows. The matching circuit includes a surface mount circuit element that is mounted to the mount surface of the multilayer substrate. The inductor is mounted to the mount surface of the multilayer substrate or located inside of the multilayer substrate. The surface mount circuit element and the inductor are arranged close to each other.

A high-frequency module according to a preferred embodiment of the present invention may have a structure as follows. The matching circuit includes a surface mount circuit element that is mounted to a mount surface of the multilayer substrate. The inductor is located inside of the cover layer. The surface mount circuit element and the inductor are arranged close to each other.

The above-described features represent a practical example of a structure of the high-frequency module having the WLP structure when the matching circuit is the surface mount circuit element. The above-described features further represent a practical example of a structure of the inductor.

With these features, the coupling between the matching circuit and the inductor is reliably obtained.

Preferably, a high-frequency module according to a preferred embodiment of the present invention has a structure as follows. The matching circuit preferably includes a rectangular or substantially rectangular parallelepiped casing, and a spiral conductor located inside of the casing and having a rectangular or substantially rectangular outer peripheral shape when looking at the high-frequency module in a plan view. The matching circuit is arranged such that a long side of the casing is close to the inductor.

With these features, the coupling between the matching circuit and the inductor is obtained easily, and an adjustment to the desired coupling degree is facilitated.

A high-frequency module according to a preferred embodiment of the present invention may have a structure as follows. The high-frequency module further includes a flat plate filter substrate including IDT electrodes that define the filter unit and that are located on a first principal surface of the filter substrate, and a flat plate filter mount substrate arranged on the first principal surface side of the filter substrate, the filter substrate being mounted at the first principal surface side thereof to the filter mount substrate. The matching circuit is mounted to or located on a mount surface of the filter mount substrate.

The above-described features represent the case of implementing the high-frequency module in a so-called CSP (Chip Size Package) structure.

The matching circuit may be a matching inductor connected in parallel to an antenna, and the matching inductor and the inductor may be located inside the multilayer substrate in a state close to each other.

With these features, since the matching inductor connected in parallel to the antenna and the inductor are close to each other, stronger inductive coupling is generated.

The matching inductor and the inductor may be line electrodes located in different layers of the multilayer substrate, the line electrode defining the matching inductor may include a portion overlapping the line electrode defining the inductor when looking at the multilayer substrate in a lamination direction thereof, and transfer directions of high-frequency signals propagating through the line electrode defining the matching inductor and through the line electrode defining the inductor may be opposite to each other in the overlapping portion.

By generating the inductive coupling between the matching inductor and the inductor With these features, an effective inductance value of the inductor is increased. As a result, a length of the line electrode defining the inductor is able to be shortened, and size reduction of the high-frequency module is able to be realized.

Preferred embodiments of the present invention provide high-frequency modules including a small-sized filter circuit that has good attenuation characteristics outside a passband.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
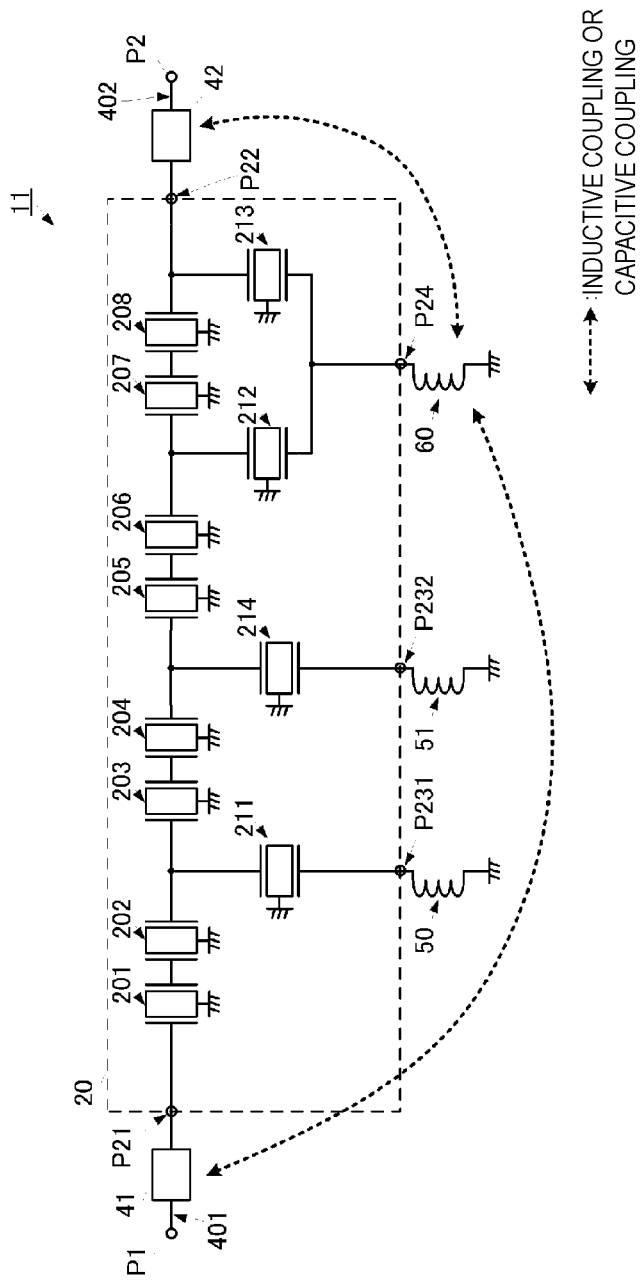
FIG. 1 is a circuit block diagram illustrating a first circuit example of a high-frequency module according to a preferred embodiment of the present invention.
Figure 2:
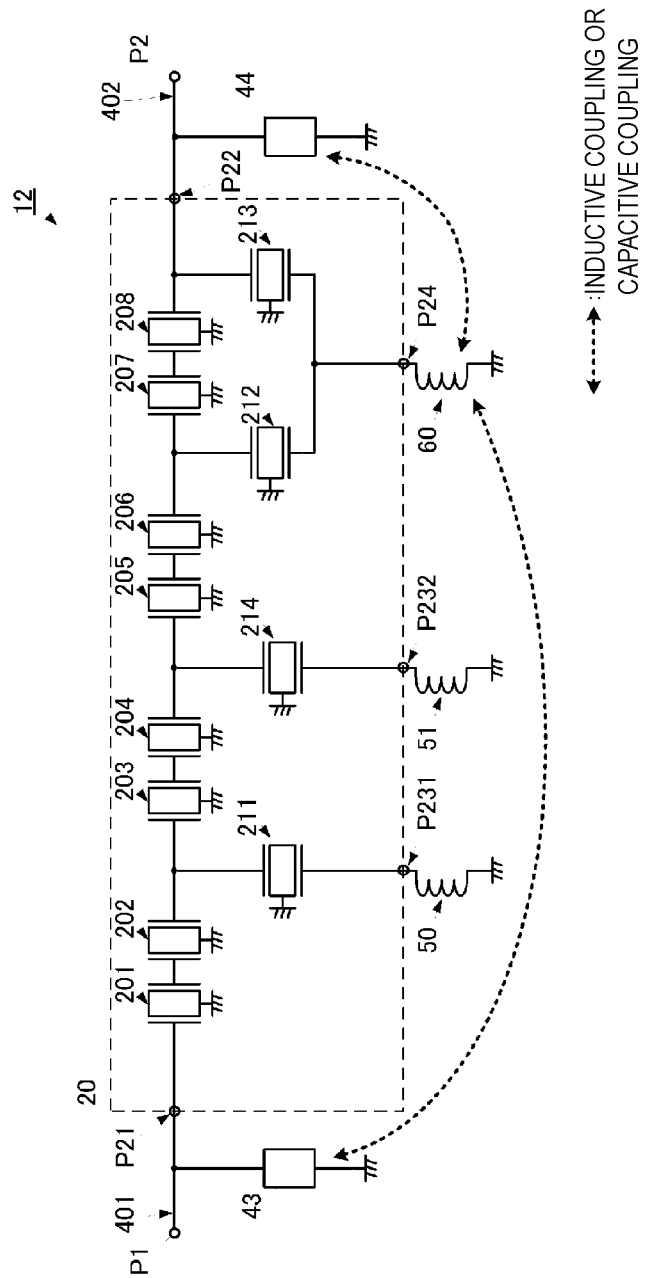
FIG. 2 is a circuit block diagram illustrating a second circuit example of a high-frequency module according to a preferred embodiment of the present invention.
Figure 3:
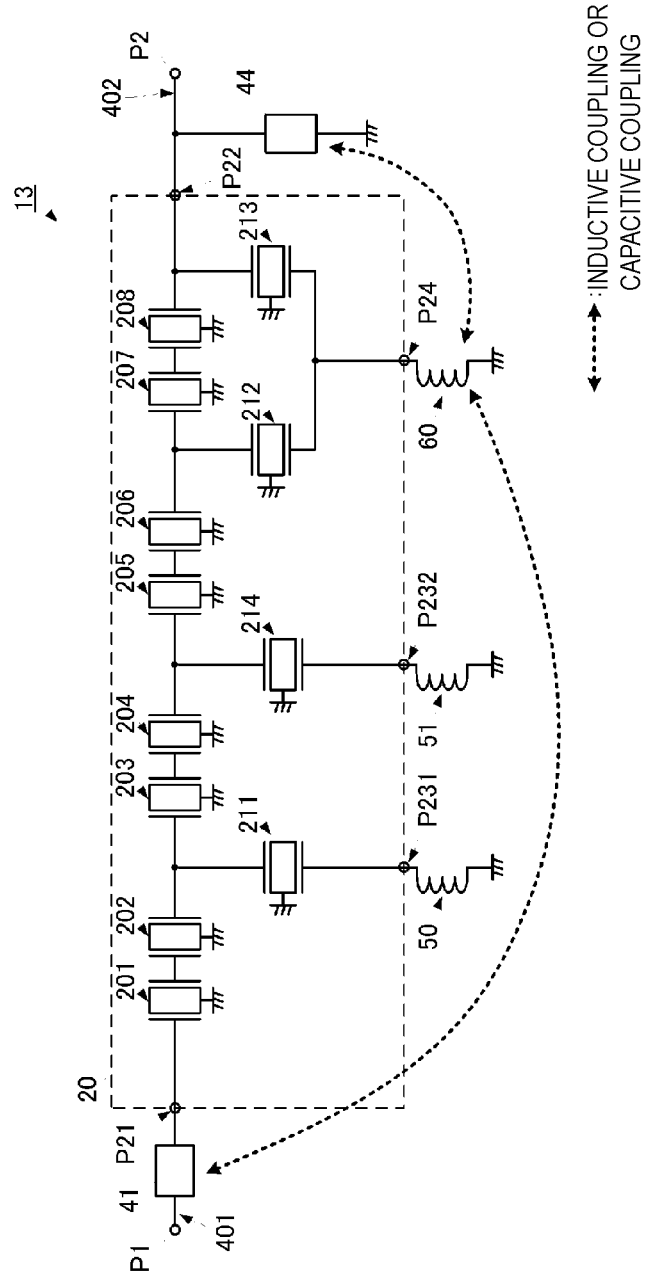
FIG. 3 is a circuit block diagram illustrating a third circuit example of a high-frequency module according to a preferred embodiment of the present invention.
Figure 4:
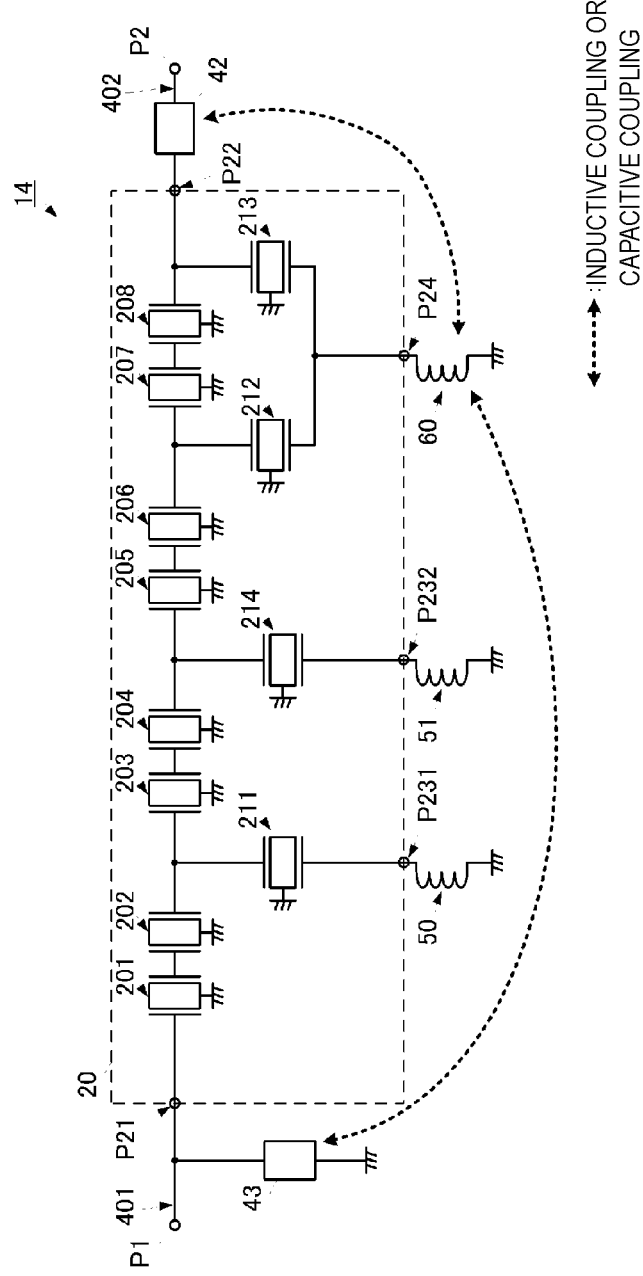
FIG. 4 is a circuit block diagram illustrating a fourth circuit example of a high-frequency module according to a preferred embodiment of the present invention.
Figure 5A:
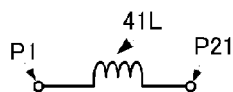
FIGS. 5A-5H are circuit diagrams illustrating practical examples of matching circuits in the high-frequency modules illustrated in FIGS. 1 to 4.
Figure 5E:
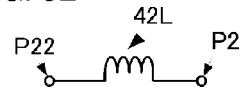
Figure 5B:
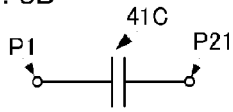
Figure 5F:
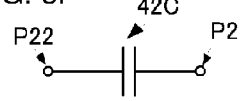
Figure 5C:
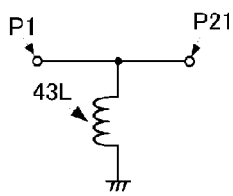
Figure 5G:
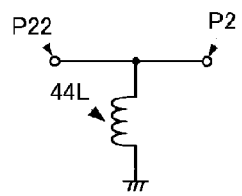
Figure 5D:
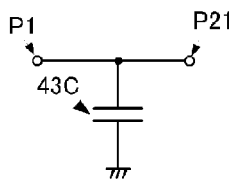
Figure 5H:
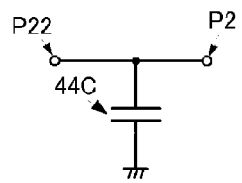

High-frequency modules according to preferred embodiments of the present invention will be described below with reference to the drawings. FIG. 1 is a circuit block diagram illustrating a first circuit example of a high-frequency module according to a preferred embodiment of the present invention. FIG. 2 is a circuit block diagram illustrating a second circuit example of a high-frequency module according to a preferred embodiment of the present invention. FIG. 3 is a circuit block diagram illustrating a third circuit example of a high-frequency module according to a preferred embodiment of the present invention. FIG. 4 is a circuit block diagram illustrating a fourth circuit example of a high-frequency module according to a preferred embodiment of the present invention. For easier understanding of the drawings, FIGS. 1 to 4 represent typical examples of inductive coupling or capacitive coupling. FIGS. 5A-5D are circuit diagrams illustrating practical examples of a matching circuit on the first external connection terminal side. FIGS. 5E-5H are circuit diagrams illustrating practical examples of a matching circuit on the second external connection terminal side.

A circuit configuration common to high-frequency modules 11, 12, 13 and 14 illustrated in FIGS. 1 to 4, respectively, are described.

Each of the high-frequency modules 11, 12, 13 and 14 includes a first external connection terminal P1, a second external connection terminal P2, and a filter unit 20. The filter unit 20 is connected between the first external connection terminal P1 and the second external connection terminal P2.

The filter unit 20 includes a first series connection terminal P21, a second series connection terminal P22, first shunt connection terminals P231 and P232, and a second shunt connection terminal P24. The first series connection terminal P21 is connected to the first external connection terminal P1 through a series-connected matching circuit or a shunt-connected matching circuit, which are described later. The second series connection terminal P22 is connected to the second external connection terminal P2 through a series-connected matching circuit or a shunt-connected matching circuit, which are described later.

The first shunt connection terminal P231 is connected to a ground through an inductor 50. The first shunt connection terminal P232 is connected to the ground through an inductor 51. The second shunt connection terminal P24 is connected to the ground through an inductor 60. The inductor 60 corresponds to an "inductor".

The filter unit 20 includes a plurality of SAW resonators 201, 202, 203, 204, 205, 206, 207 and 208 (hereinafter, when the plurality of SAW resonators will be described collectively, they are simply referred to as the plural SAW resonators 201 to 208). Those SAW resonators correspond to "series-connected filter elements". The filter unit 20 further includes a plurality of SAW resonators 211, 212, 213, and 214. The SAW resonator 212 corresponds to a "first shunt-connected filter element". The SAW resonator 213 corresponds to a "second shunt-connected filter element".

The plural SAW resonators 201 to 208, 211, 212, 213 and 214 have respective resonant frequencies and function as bandpass filters (BPFs) having respective specific bandpass characteristics. The plural SAW resonators 201 to 208 are connected in series between the first series connection terminal P21 and the second series connection terminal P22 through a plurality of connection lines.

The SAW resonator 211 is connected between the connection line that interconnects the SAW resonators 202 and 203, and the first shunt connection terminal P231. The SAW resonator 214 is connected between the connection line that interconnects the SAW resonators 204 and 205, and the first shunt connection terminal P232.

The SAW resonator 212 is connected between the connection line that interconnects the SAW resonators 206 and 207, and the second shunt connection terminal P24. The SAW resonator 213 is connected between the connection line that interconnects the SAW resonator 208 and the second series connection terminal P22, and the second shunt connection terminal P24. In other words, the second shunt connection terminal P24 is a terminal common to the SAW resonators 212 and 213, and respective one ends of the SAW resonators 212 and 213 are collectively connected to the ground.

The connection line interconnecting the SAW resonators 206 and 207 corresponds to a "first connection line". The connection line interconnecting the SAW resonator 208 and the second series connection terminal P22 corresponds to a "second connection line".

With the unique structure described above, the filter unit 20 defines a so-called ladder-connected filter. Desired bandpass characteristics of the filter unit 20 and desired attenuation characteristics thereof outside of the passband are realized by combining individual bandpass characteristics and attenuation characteristics of the SAW resonators 201 to 208, 211, 212, 213 and 214. The number and layout of the SAW resonators may be optionally changed to obtain the frequency band of a signal, which is to be passed, and the desired attenuation characteristics outside of the passband.

In addition to the above circuit configuration common to the high-frequency modules 11, 12, 13 and 14, the high-frequency modules have the following practical circuit configurations.

First Circuit Example

The high-frequency module 11 illustrated in FIG. 1 includes series-connected matching circuits 41 and 42. One of the matching circuits 41 and 42 may be omitted.

The matching circuit 41 is connected between the first series connection terminal P21 of the filter unit 20 and the first external connection terminal P1. More specifically, the matching circuit 41 includes an inductor 41L illustrated in FIG. 5A, which is connected in series between the first series connection terminal P21 and the first external connection terminal P1, or a capacitor 41C illustrated in FIG. 5B, which is connected in series between the first series connection terminal P21 and the first external connection terminal P1. An element value (inductance or capacitance) of the matching circuit 41 is set to an element value that establishes impedance matching between a circuit connected to the first external connection terminal P1 and the filter unit 20.

The matching circuit 42 is connected between the second series connection terminal P22 of the filter unit 20 and the second external connection terminal P2. More specifically, the matching circuit 42 includes an inductor 42L illustrated in FIG. 5E, which is connected in series between the second series connection terminal P22 and the second external connection terminal P2, or a capacitor 42C illustrated in FIG. 5F, which is connected in series between the second series connection terminal P22 and the second external connection terminal P2. An element value (inductance or capacitance) of the matching circuit 42 is set to an element value that establishes impedance matching between a circuit connected to the second external connection terminal P2 and the filter unit 20.

Furthermore, at least one of the matching circuits 41 and 42 is inductively coupled to the inductor 60, or capacitively coupled to at least a portion of a conductor defining the inductor 60. In other words, when the coupled matching circuit includes an inductor, the relevant matching circuit is inductively coupled to the inductor 60, or capacitively coupled to at least a portion of the conductor defining the inductor 60. When the coupled matching circuit includes a capacitor, the relevant matching circuit is capacitively coupled to at least a portion of the conductor defining the inductor 60.

For example, when the matching circuit 41 includes the inductor 41L, the inductor 41L is inductively coupled to the inductor 60, or capacitively coupled to at least a portion of the conductor defining the inductor 60. When the matching circuit 41 includes the capacitor 41C, the capacitor 41C is capacitively coupled to at least a portion of the conductor defining the inductor 60.

For example, when the matching circuit 42 includes the inductor 42L, the inductor 42L is inductively coupled to the inductor 60, or capacitively coupled to at least a portion of the conductor defining the inductor 60. When the matching circuit 42 includes the capacitor 42C, the capacitor 42C is capacitively coupled to at least a portion of the conductor defining the inductor 60.

With the unique structure described above, the inductor and the matching circuit, which are to be coupled, are connected to each other in a high-frequency mode. For example, when the matching circuit 41 includes the inductor 41L and the inductor 41L is inductively coupled to the inductor 60 (see FIG. 1), an inductive coupling circuit having mutual inductance is defined between the inductor 41L (matching circuit 41) and the inductor 60. Accordingly, a high-frequency signal is propagated between the first external connection terminal P1 and the second external connection terminal P2 not merely through a main propagation path that includes the filter unit 20 as a propagation path, and a portion of the high-frequency signal is also propagated through an auxiliary propagation path that is a propagation path including the inductor 41L (matching circuit 41), the inductive coupling circuit, and the inductor 60.

As a result, the high-frequency module 11 exhibits combined transfer characteristics resulting from combining transfer characteristics of the main propagation path and transfer characteristics of the auxiliary propagation path.

Here, the amplitude and the phase of the high-frequency signal propagating through the auxiliary propagation path is able to be adjusted by adjusting a coupling mode and a coupling degree between the matching circuit and the inductor, which are to be coupled. In other words, transfer characteristics of the auxiliary propagation path are adjustable. The term "transfer characteristics" implies, for example, attenuation characteristics (amplitude characteristics) and phase characteristics.

Furthermore, by adjusting the coupling mode and the coupling degree, influences resulting from disposing the auxiliary propagation path are caused to act on only the attenuation characteristics outside of the passband without substantially affecting the transfer characteristics in a frequency band of the high-frequency signal that is to be passed through the high-frequency module 11 (i.e., of the desired high-frequency signal).

Thus, by adjusting the transfer characteristics of the auxiliary propagation path as mentioned above, the transfer characteristics of the high-frequency module 11 are able to be adjusted. For example, the attenuation characteristics outside of the passband are able to be adjusted as described later.

Since an inductor or a capacitor used in the related art for adjusting transfer characteristics of a high-frequency filter is not needed separately, a high-frequency filter having desired attenuation characteristics is implemented with a simpler configuration. As a result, the high-frequency filter is able to be formed to have a smaller size.

Moreover, effective inductance values of the inductor 41L (matching circuit 41) and the inductor 60 are increased due to a mutual induction component caused by the above-mentioned coupling. Accordingly, line lengths of the inductor 41L and the inductor 60 are able to be shortened.

Second Circuit Example

The high-frequency module 12 illustrated in FIG. 2 includes shunt-connected matching circuits 43 and 44. One of the matching circuits 43 and 44 may be omitted.

The matching circuit 43 is connected between a connection line 401, which interconnects the first series connection terminal P21 of the filter unit 20 and the first external connection terminal P1, and the ground. More specifically, the matching circuit 43 includes an inductor 43L illustrated in FIG. 5C, which is connected between the connection line 401 interconnecting the first series connection terminal P21 and the first external connection terminal P1 and the ground, or a capacitor 43C illustrated in FIG. 5D, which is connected between the connection line 401 interconnecting the first series connection terminal P21 and the first external connection terminal P1 and the ground. An element value (inductance or capacitance) of the matching circuit 43 is set to an element value that establishes impedance matching between a circuit connected to the first external connection terminal P1 and the filter unit 20.

The matching circuit 44 is connected between a connection line 402, which interconnects the second series connection terminal P22 of the filter unit 20 and the second external connection terminal P2, and the ground. More specifically, the matching circuit 44 includes an inductor 44L illustrated in FIG. 5G, which is connected between the connection line 402 interconnecting the second series connection terminal P22 and the second external connection terminal P2 and the ground, or a capacitor 44C illustrated in FIG. 5H, which is connected between the connection line 402 interconnecting the second series connection terminal P22 and the second external connection terminal P2 and the ground. An element value (inductance or capacitance) of the matching circuit 44 is set to an element value that establishes impedance matching between a circuit connected to the second external connection terminal P2 and the filter unit 20.

Furthermore, at least one of the matching circuits 43 and 44 is inductively coupled to the inductor 60, or capacitively coupled to at least a portion of the conductor defining the inductor 60. In other words, when the coupled matching circuit includes an inductor, the relevant matching circuit is inductively coupled to the inductor 60, or capacitively coupled to at least a portion of the conductor defining the inductor 60. When the coupled matching circuit includes a capacitor, the relevant matching circuit is capacitively coupled to at least a portion of the conductor defining the inductor 60.

For example, when the matching circuit 43 includes the inductor 43L, the inductor 43L is inductively coupled to the inductor 60, or capacitively coupled to at least a portion of the conductor defining the inductor 60. When the matching circuit 43 includes the capacitor 43C, the capacitor 43C is capacitively coupled to at least a portion of the conductor defining the inductor 60.

For example, when the matching circuit 44 includes the inductor 44L, the inductor 44L is inductively coupled to the inductor 60, or capacitively coupled to at least a portion of the conductor defining the inductor 60. When the matching circuit 44 includes the capacitor 44C, the capacitor 44C is capacitively coupled to at least a portion of the conductor defining the inductor 60.

With the unique structure described above, the inductor and the matching circuit, which are to be coupled, are connected to each other in a high-frequency mode. For example, when the matching circuit 44 includes the capacitor 44C and the capacitor 44C is capacitively coupled to the conductor defining the inductor 60 (see FIG. 2), a capacitive coupling circuit having coupling capacitance is defined between the capacitor 44C (matching circuit 44) and the conductor defining the inductor 60. Accordingly, a high-frequency signal is propagated between the first external connection terminal P1 and the second external connection terminal P2 not merely through the main propagation path that is a propagation path including the filter unit 20, and a portion of the high-frequency signal is also propagated through an auxiliary propagation path that is a propagation path including the inductor 60, the capacitive coupling circuit, and the capacitor 44C (matching circuit 44).

As a result, the high-frequency module 12 exhibits combined transfer characteristics resulting from combining transfer characteristics of the main propagation path and transfer characteristics of the auxiliary propagation path.

The high-frequency module 12 have a unique structure as described above realizes, similarly to the above-described high-frequency module 11, the desired attenuation characteristics with a simpler configuration than that in the related art.

Third Circuit Example

The high-frequency module 13 illustrated in FIG. 3 includes the series-connected matching circuit 41 and the shunt-connected matching circuit 44.

The matching circuit 41 is connected between the first series connection terminal P21 of the filter unit 20 and the first external connection terminal P1. More specifically, the matching circuit 41 includes the inductor 41L illustrated in FIG. 5A, which is connected in series between the first series connection terminal P21 and the first external connection terminal P1, or the capacitor 41C illustrated in FIG. 5B, which is connected in series between the first series connection terminal P21 and the first external connection terminal P1. An element value (inductance or capacitance) of the matching circuit 41 is set to an element value that establishes impedance matching between a circuit connected to the first external connection terminal P1 and the filter unit 20.

The matching circuit 44 is connected between the connection line 402, which interconnects the second series connection terminal P22 of the filter unit 20 and the second external connection terminal P2, and the ground. More specifically, the matching circuit 44 includes the inductor 44L illustrated in FIG. 5G, which is connected between the connection line 402 interconnecting the second series connection terminal P22 and the second external connection terminal P2 and the ground, or the capacitor 44C illustrated in FIG. 5H, which is connected between the connection line 402 interconnecting the second series connection terminal P22 and the second external connection terminal P2 and the ground. An element value (inductance or capacitance) of the matching circuit 44 is set to an element value that establishes impedance matching between a circuit connected to the second external connection terminal P2 and the filter unit 20.

Furthermore, at least one of the matching circuits 41 and 44 is inductively coupled to the inductor 60, or capacitively coupled to at least a portion of the conductor defining the inductor 60. In other words, when the coupled matching circuit includes an inductor, the relevant matching circuit is inductively coupled to the inductor 60, or capacitively coupled to at least a portion of the conductor defining the inductor 60. When the coupled matching circuit includes a capacitor, the relevant matching circuit is capacitively coupled to at least a portion of the conductor defining the inductor 60.

For example, when the matching circuit 41 includes the inductor 41L, the inductor 41L is inductively coupled to the inductor 60, or capacitively coupled to at least a portion of the conductor defining the inductor 60. When the matching circuit 41 includes the capacitor 41C, the capacitor 41C is capacitively coupled to at least a portion of the conductor defining the inductor 60.

For example, when the matching circuit 44 includes the inductor 44L, the inductor 44L is inductively coupled to the inductor 60, or capacitively coupled to at least a portion of the conductor defining the inductor 60. When the matching circuit 44 includes the capacitor 44C, the capacitor 44C is capacitively coupled to at least a portion of the conductor defining the inductor 60.

As a result, the high-frequency module 13 exhibits combined transfer characteristics resulting from combining transfer characteristics of a main propagation path through the filter unit 20 and transfer characteristics of an auxiliary propagation path through a coupling portion. The high-frequency module 13 have a unique structure as described above also realizes, similarly to the above-described high-frequency modules 11 and 12, the desired attenuation characteristics with a simpler configuration than that in the related art.

Fourth Circuit Example

The high-frequency module 14 illustrated in FIG. 4 includes the series-connected matching circuit 42 and the shunt-connected matching circuit 43.

The matching circuit 42 is connected between the second series connection terminal P22 of the filter unit 20 and the second external connection terminal P2. More specifically, the matching circuit 42 includes the inductor 42L illustrated in FIG. 5E, which is connected in series between the second series connection terminal P22 and the second external connection terminal P2, or the capacitor 42C illustrated in FIG. 5F, which is connected in series between the second series connection terminal P22 and the second external connection terminal P2. An element value (inductance or capacitance) of the matching circuit 42 is set to an element value that establishes impedance matching between a circuit connected to the second external connection terminal P2 and the filter unit 20.

The matching circuit 43 is connected between the connection line 401, which interconnects the first series connection terminal P21 of the filter unit 20 and the first external connection terminal P1, and the ground. More specifically, the matching circuit 43 includes the inductor 43L illustrated in FIG. 5C, which is connected between the connection line 401 interconnecting the first series connection terminal P21 and the first external connection terminal P1 and the ground, or the capacitor 43C illustrated in FIG. 5D, which is connected between the connection line 401 interconnecting the first series connection terminal P21 and the first external connection terminal P1 and the ground. An element value (inductance or capacitance) of the matching circuit 43 is set to an element value that establishes impedance matching between a circuit connected to the first external connection terminal P1 and the filter unit 20.

Furthermore, at least one of the matching circuits 42 and 43 is inductively coupled to the inductor 60, or capacitively coupled to at least a portion of the conductor defining the inductor 60. In other words, when the coupled matching circuit includes an inductor, the relevant matching circuit is inductively coupled to the inductor 60, or capacitively coupled to at least a portion of the conductor defining the inductor 60. When the coupled matching circuit includes a capacitor, the relevant matching circuit is capacitively coupled to at least a portion of the conductor defining the inductor 60.

For example, when the matching circuit 42 includes the inductor 42L, the inductor 42L is inductively coupled to the inductor 60, or capacitively coupled to at least a portion of the conductor defining the inductor 60. When the matching circuit 42 includes the capacitor 42C, the capacitor 42C is capacitively coupled to at least a portion of the conductor defining the inductor 60.

For example, when the matching circuit 43 includes the inductor 43L, the inductor 43L is inductively coupled to the inductor 60, or capacitively coupled to at least a portion of the conductor defining the inductor 60. When the matching circuit 43 includes the capacitor 43C, the capacitor 43C is capacitively coupled to at least a portion of the conductor defining the inductor 60.

As a result, the high-frequency module 14 exhibits combined transfer characteristics resulting from combining transfer characteristics of a main propagation path through the filter unit 20 and transfer characteristics of an auxiliary propagation path through a coupling portion. The high-frequency module 14 with a unique structure as described above also realizes, similarly to the above-described high-frequency modules 11, 12 and 13, the desired attenuation characteristics with a simpler configuration than that in the related art.

Figure 6:
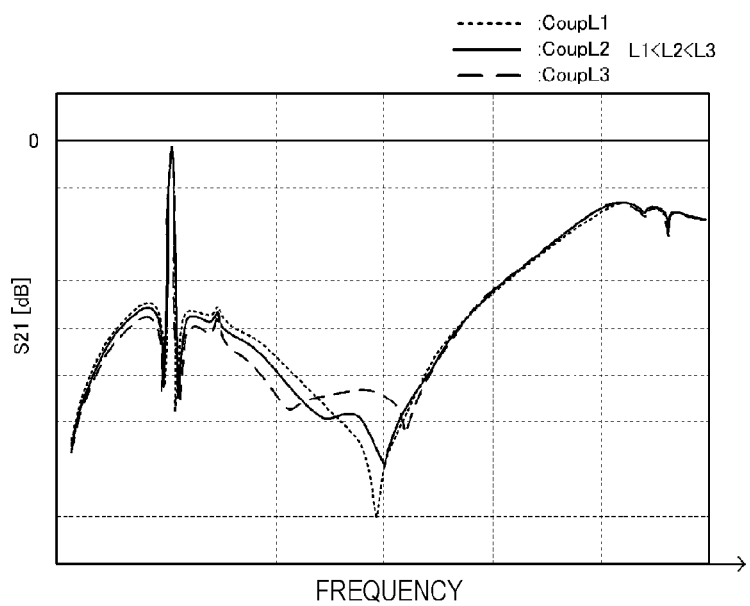
FIG. 6 is a graph depicting changes in bandpass characteristics of the high-frequency module when a coupling degree of inductive coupling between the matching circuit and an inductor is changed.

FIG. 6 is a graph depicting changes in bandpass characteristics of the high-frequency module when the coupling degree of the inductive coupling between the matching circuit and the inductor is changed. A horizontal axis of FIG. 6 indicates frequency, and a vertical axis of FIG. 6 indicates an attenuation amount of a signal propagating from the first external connection terminal P1 to the second external connection terminal P2. A characteristic denoted by a dotted line in FIG. 6 represents the case where the inductive coupling between the matching circuit and the inductor is weak. A characteristic denoted by a solid line in FIG. 6 represents the case where the inductive coupling is stronger than that in the case of the characteristic denoted by the solid line. A characteristic denoted by a broken line in FIG. 6 represents the case where the inductive coupling is stronger than that in the case of the characteristic denoted by the solid line. It is to be noted that the high-frequency module according to this preferred embodiment preferably is a bandpass filter with a passband set to a 800-MHz band, for example.

As seen from FIG. 6, the stronger the inductive coupling, the higher the frequency of an attenuation pole that appears on the higher frequency side of the passband. The frequency of the attenuation pole in FIG. 6 implies a peak frequency that is present at or substantially at a middle of the frequency axis.

The attenuation characteristics on the higher frequency side of the passband are able to be changed by appropriately setting the inductive coupling. For example, as the inductive coupling weakens, the attenuation amount near the passband decreases, but the attenuation amount at the frequency of the attenuation pole takes a larger value. Moreover, as the inductive coupling intensifies, the attenuation amount near the passband takes a larger value.

In addition, as seen from FIG. 6, a frequency position, a frequency width, and an insertion loss in the passband are hardly changed without being affected by the intensity of the inductive coupling.

Thus, by appropriately adjusting the coupling degree of the inductive coupling in accordance with the unique structure of this preferred embodiment, the attenuation characteristics on the higher frequency side is able to be adjusted to the desired characteristics without changing passband characteristics. In other words, the high-frequency module having the desired passband characteristics and the desired attenuation characteristics are able to be realized.

Though not illustrated, when the matching circuit and the conductor defining the inductor are capacitively coupled to each other, the frequency of the attenuation pole appearing on the higher frequency side of the passband lowers as the capacitive coupling intensifies. Furthermore, a frequency position, a frequency width, and an insertion loss in the passband are hardly changed without being affected by the intensity of the capacitive coupling. Thus, by appropriately adjusting the coupling degree of the capacitive coupling in accordance with the unique structure of this preferred embodiment, the attenuation characteristics on the higher frequency side are able to be adjusted to the desired characteristics without changing the passband characteristics.

Figure 7:
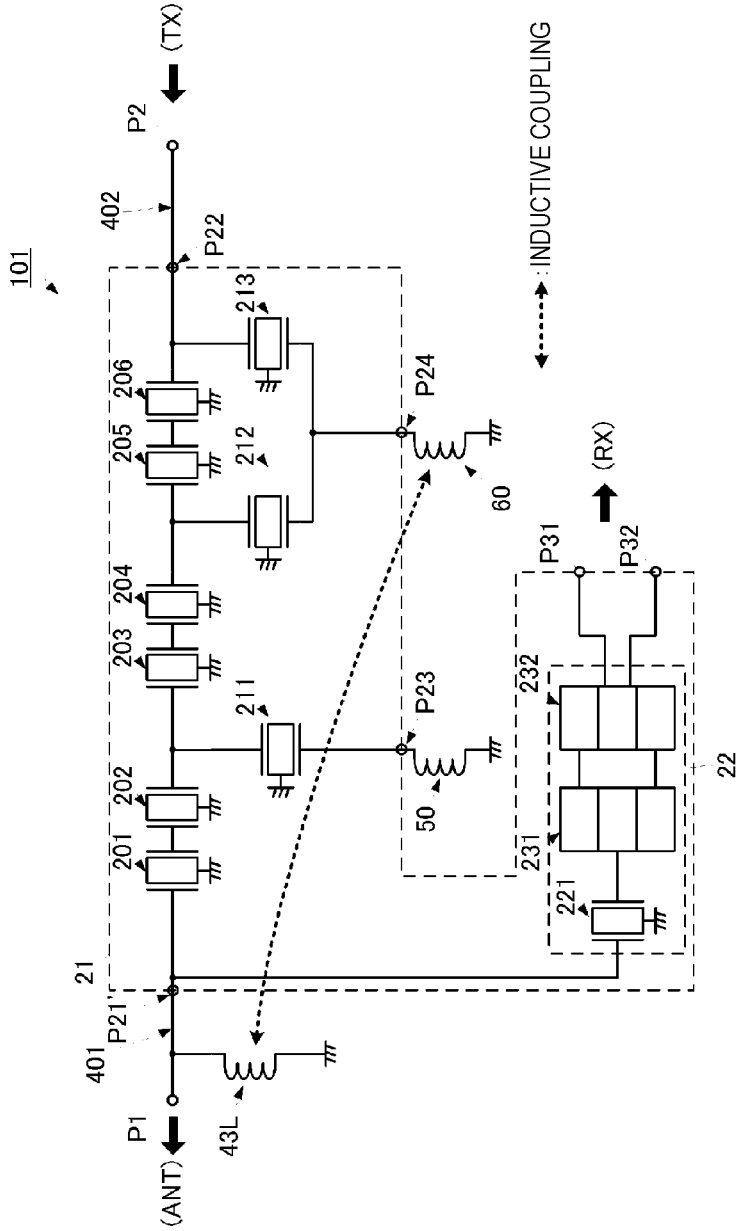
FIG. 7 is an equivalent circuit diagram of a high-frequency module with a duplexer configuration.

The high-frequency module with the unique structure as described above is able to be utilized, as a practical application example, in a duplexer illustrated in FIG. 7. FIG. 7 is an equivalent circuit diagram of a high-frequency module with the duplexer structure.

The high-frequency module, denoted by 101, includes a filter unit 21, a first external connection terminal P1, a second external connection terminal P2, and a third external connection terminal that defines and functions also as each of third terminals P31 and P32 of the filter unit 21. In a practical application example, the first external connection terminal P1 is connected to an antenna. The second external connection terminal P2 is connected to a transmission circuit. The third external connection terminal (third terminals P31 and P32) is connected to a reception circuit.

The filter unit 21 includes a first series connection terminal P21', a second series connection terminal P22, a first shunt connection terminal P23, a second shunt connection terminal P24, and third terminals P31 and P32.

The first series connection terminal P21' is connected to the first external connection terminal P1 through a connection line 401. An inductor 43L corresponding to the above-described matching circuit is connected between the connection line 401 and the ground. The second series connection terminal P22 is connected to the second external connection terminal P2 through a connection line 402.

A plurality of SAW resonators 201, 202, 203, 204, 205 and 206 are connected in series between the first series connection terminal P21' and the second series connection terminal P22 through a plurality of connection lines.

The connection line interconnecting the SAW resonator 202 and the SAW resonator 203 is connected to the first shunt connection terminal P23 through a SAW resonator 211. The first shunt connection terminal P23 is connected to the ground through an inductor 50.

The connection line interconnecting the SAW resonator 204 and the SAW resonator 205 is connected to the second shunt connection terminal P24 through a SAW resonator 212. The connection line interconnecting the SAW resonator 206 and the second series connection terminal P22 is connected to the second shunt connection terminal P24 through a SAW resonator 213. The second shunt connection terminal P24 is connected to the ground through an inductor 60.

With the unique structure described above, the filter unit 21 realizes desired first bandpass characteristics and desired first attenuation characteristics outside a first passband between the first and second series connection terminals P21' and P22 of the filter unit 21 by combining respective bandpass characteristics and respective attenuation characteristics of the SAW resonators 201 to 206, 211, 212 and 213 between the first series connection terminal P21' and the second series connection terminal P22.

A SAW resonator 221 and longitudinally-coupled two SAW resonators 231 and 232 are connected in series between the first series connection terminal P21' and the third terminals P31 and P32. The SAW resonator 221 and the longitudinally-coupled SAW resonators 231 and 232 define a second filter unit 22. With the unique structure described above, the filter unit 21 realizes desired second bandpass characteristics and desired second attenuation characteristics outside a second passband between the first series connection terminal P21' and the third terminals P31 and P32 of the filter unit 21 by combining respective bandpass characteristics and respective attenuation characteristics of the SAW resonators 221, 231 and 232 between the first series connection terminal P21' and the third terminals P31 and P32. The second passband is a frequency band different from the first passband, and is set to fall within an attenuation band outside the first passband.

As a result, the filter unit 21 defines and functions as a duplexer in which the first series connection terminal P21' defines and functions as a common terminal, and the second series connection terminal P22 and the third terminals P31 and P32 define and function as separate terminals.

Moreover, in the high-frequency module 101, the inductor 60 and the inductor 43L are inductively coupled to each other. The first attenuation characteristics are able to be adjusted by adjusting a coupling degree of the inductive coupling therebetween.

With the unique structure of this preferred embodiment, it is possible to adjust a band width and an attenuation amount in a frequency band, in which a large attenuation amount is obtained in the first attenuation characteristics, in an overlapping relation to the second bandpass. Such an adjustment is able to be realized by adjusting the coupling degree between the inductor 60 and the inductor 43L.

Figure 8:
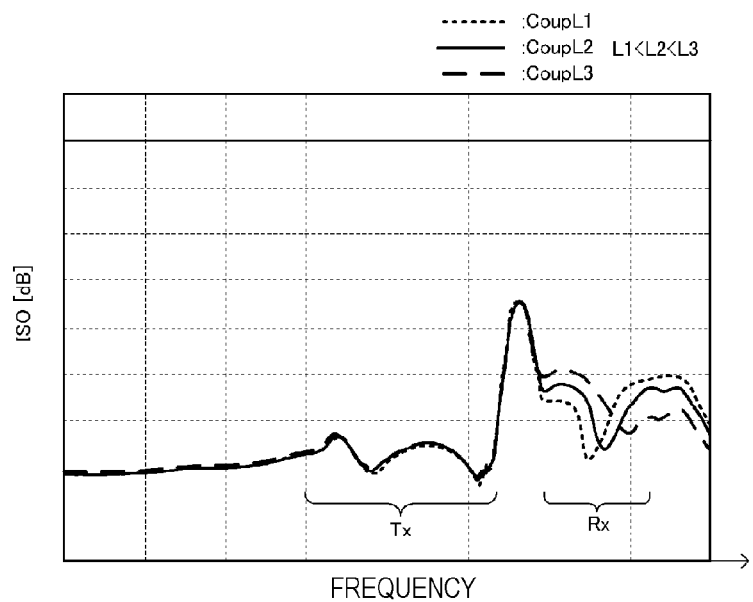
FIG. 8 is a graph depicting changes in isolation between a second external connection terminal and a third external connection terminal of the high-frequency module when the coupling degree of the inductive coupling between the matching circuit and the inductor is changed.

FIG. 8 is a graph depicting changes in isolation between the second external connection terminal and the third external connection terminal of the high-frequency module when the coupling degree of the inductive coupling between the matching circuit and the inductor is changed. A horizontal axis of FIG. 8 indicates frequency, and a vertical axis of FIG. 8 indicates an isolation variable. In FIG. 8, a smaller isolation variable indicates stronger isolation between the second series connection terminal and the third terminals. A characteristic denoted by a dotted line in FIG. 8 represents the case where the inductive coupling is weak. A characteristic denoted by a solid line in FIG. 8 represents the case where the inductive coupling is stronger than that in the case of the characteristic denoted by the dotted line. A characteristic denoted by a broken line in FIG. 8 represents the case where the inductive coupling is stronger than that in the case of the characteristic denoted by the solid line.

As seen from FIG. 8, the stronger the inductive coupling, the higher the frequency of an attenuation pole that appears near a passband of the reception circuit Rx (third terminal side). Therefore, the isolation variable and isolation characteristics in the passband of the reception circuit Rx are able to be adjusted by adjusting the inductive coupling. Furthermore, as seen from FIG. 8, the isolation variable and isolation characteristics in a passband of the transmission circuit Tx (second terminal side) are hardly changed even with the adjustment of the inductive coupling.

Thus, the isolation characteristics between the second series connection terminal and the third terminals are able to be appropriately adjusted by using the unique structure of the high-frequency module 101. In other words, isolation characteristics between the transmission circuit and the reception circuit are significantly improved or optimized.

Though not illustrated, when the capacitor 43C is preferably used as the matching circuit instead of the inductor 43L and when the relevant matching circuit and the conductor defining the inductor are capacitively coupled to each other, the frequency of the attenuation pole appearing near the passband of the reception circuit Rx lowers as the capacitive coupling intensifies. Accordingly, the isolation variable and the isolation characteristics in the passband of the reception circuit Rx (third terminal side) are able to be adjusted by adjusting the capacitive coupling. Moreover, the isolation variable and the isolation characteristics in the passband of the transmission circuit Tx are hardly changed even with the adjustment of the capacitive coupling. Thus, the isolation characteristics between the second series connection terminal and the third terminals are also able to be appropriately adjusted by appropriately adjusting the capacitive coupling.

The high-frequency module with the unique structure described above is able to be implemented with one of the following structures. The following represents examples of implementing the high-frequency module 101 with the above-described duplexer structure in practical structures.

First Structure

Figure 9:
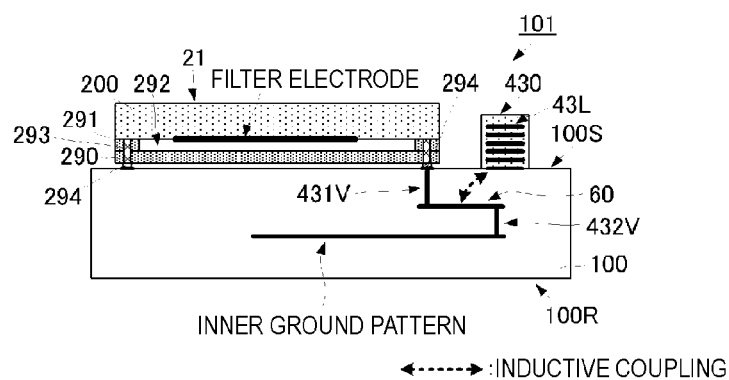
FIG. 9 is a conceptual side view illustrating a main structure of a first structure of the high-frequency module.

FIG. 9 is a conceptual side view illustrating a main structure of the high-frequency module. The high-frequency module 101 includes a multilayer substrate 100, a filter substrate 200, a cover layer 290, a side cover layer 291, and a surface mount circuit element 430.

The multilayer substrate 100 is formed preferably by laminating a plurality of dielectric layers. On a top surface (mount surface) 100S and in inner layers of the multilayer substrate 100, there are formed not only electrodes in predetermined patterns, but also the inductor 60 and wiring patterns except for the filter unit 21 of the high-frequency module 101.

The inductor 60 is defined by a partly-cut pipe-shaped line electrode (line conductor). One end of the line electrode is connected, through a via conductor 431V, to a land electrode to which a mount electrode 294 defining and functioning as the first shunt connection terminal P23 of the filter unit 21 is mounted. The land electrode is formed on the top surface 100S of the multilayer substrate 100. The other end of the line electrode defining the inductor 60 is connected, through a via conductor 432V, to an inner ground pattern formed inside the multilayer substrate 100.

External connection electrodes are formed on a bottom surface 100R of the multilayer substrate 100. The first external connection terminal P1, the second external connection terminal P2, and the third external connection terminal, described above, are defined by the external connection electrodes.

The filter unit 21 includes the filter substrate 200, the cover layer 290, the side cover layer 291, a connection electrode 293, and the mount electrode 294.

The filter substrate 200 is a piezoelectric substrate that is preferably a flat plate. Filter electrodes and wiring patterns are located on a first principal surface of the filter substrate 200. The filter electrodes are defined by, for example, IDT (interdigital transducer) electrodes. Thus, the above-described SAW resonators is able to be implemented by forming the IDT electrodes on the principal surface of the piezoelectric substrate. The cover layer 290 is disposed on the first principal surface side of the filter substrate 200. The cover layer 290 preferably is made of an insulating material in the form of a flat plate, and it has the same shape as that of the filter substrate 200 when looking at the filter unit 21 in a plan view. Furthermore, the cover layer 290 is arranged in an overlapping relation to the filter substrate 200, when looked at in the plan view, in such a state that the cover layer 290 is spaced from the first principal surface of the filter substrate 200 through a predetermined distance.

The side cover layer 291 is arranged between the first principal surface of the filter substrate 200 and the cover layer 290. The side cover layer 291 is also made of an insulating layer, and it is formed over entire peripheries of the filter substrate 200 and the cover layer 290 only in a region of a predetermined width spanning inward from outer peripheral ends thereof when looked at in the plan view. In other words, the side cover layer 291 is of a frame-shaped structure having an opening at a center.

Since the cover layer 290 and the side cover layer 291 are disposed as described, a region in the first principal surface of the filter substrate 200 where the filter electrodes are located is positioned inside an enclosed space 292 that is surrounded by the filter substrate 200, the cover layer 290, and the side cover layer 291. As a result, resonance characteristics of the SAW resonators are greatly improved, and desired characteristics as a filter are realized with high accuracy.

The connection electrode 293 preferably has one end that is contacted with the first principal surface of the filter substrate 200, and the other end that is exposed at a surface of the cover layer 290 on the opposite side away from the filter substrate 200. The connection electrode 293 penetrates through the side cover layer 291 and the cover layer 290. The one end of the connection electrode 293 is connected to the wiring pattern located on the first principal surface of the filter substrate 200.

The mount electrode 294 has a structure that enables connection to the other end of the connection electrode 293 and projects from the surface of the cover layer 290 on the opposite side away from the filter substrate 200. The first series connection terminal P21', the second series connection terminal P22, the third terminals P31 and P32, the first shunt connection terminal P23, and the second shunt connection terminal P24 of the filter unit 21 are implemented by disposing plural sets of the connection electrode 293 and the mount electrode 294. A bump may be provided at the other end of the connection electrode 293 by employing, e.g., a solder or Au, and the mount electrode 294 may be connected to the other end of the connection electrode 293 through the bump.

With the unique structure described above, the filter unit 21 has a so-called WLP (Wafer Level Package) structure, and the filter unit 21 achieves a smaller size.

The filter unit 21 having the WLP structure is mounted to the top surface 100S of the multilayer substrate 100. As a result, the filter unit 21 is connected to the first external connection terminal P1, the second external connection terminal P2, and the third external connection terminal.

The inductor 43L is implemented by the surface mount circuit element 430. More specifically, the surface mount circuit element 430 includes a rectangular or substantially rectangular parallelepiped casing made of an insulating material, and a spiral electrode that defines and functions as the inductor 43L and that is located inside of the casing. The spiral electrode is defined by partly-cut pipe-shaped line electrodes each extending along an outer periphery of the casing, and by interlayer connection electrodes. The line electrodes in individual layers are interconnected through the interlayer connection electrodes to define one line electrode. Both ends of the spiral electrode are connected respectively to external connection electrodes disposed opposite to both end surfaces of the casing.

The surface mount circuit element 430 having the above-described structure is mounted to the top surface 100S of the multilayer substrate 100 such that a center axis of the spiral electrode is perpendicular or substantially perpendicular to the top surface 100S. The connection line interconnecting the first series connection terminal P21' of the filter unit 21 and the first external connection terminal P1 is located on the top surface 100S of the multilayer substrate 100 and inside the multilayer substrate 100, and the ground electrode is located inside of the multilayer substrate 100. The above connection line and the ground electrode are connected to respective mount lands of the surface mount circuit element 430. It is hence possible to obtain a structure in which the inductor 43L is connected between the connection line interconnecting the first series connection terminal P21' of the filter unit 21 and the first external connection terminal P1 and the ground.

The inductor 43L may be implemented by a line electrode located on the top surface 100S of the multilayer substrate 100.

Furthermore, the surface mount circuit element 430 defining the inductor 43L and the line electrode defining the inductor 60 are arranged close to each other. As a result, inductive coupling is generated between the inductor 43L defined by the spiral electrode of the surface mount circuit element 430 and the inductor 60 defined by the line electrode inside the multilayer substrate 100, as denoted by a thick broken-line arrow in FIG. 9. With such a configuration, the high-frequency module 101 having the desired attenuation characteristics is implemented without separately disposing an element dedicated for adjusting the attenuation characteristics.

A coupling degree between the inductor 43L and the inductor 60 is able to be adjusted by changing a distance between the line electrode defining the inductor 60 and the spiral electrode defining the inductor 43L. As a result, the attenuation characteristics of the high-frequency module 101 are able to be adjusted, and the desired attenuation characteristics are realized with higher accuracy.

Figure 10:
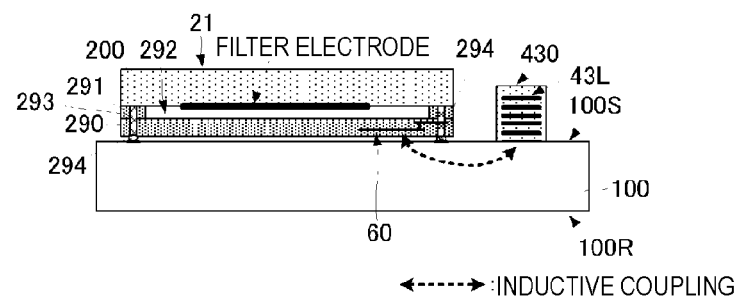
FIG. 10 is a conceptual side view illustrating a main structure of a modification in the first structure of the high-frequency module.

As illustrated in FIG. 10, the inductor 60 may be located in the cover layer 290 instead of being located inside the multilayer substrate 100. The inductor 60 is preferably defined by a partly-cut pipe-shaped line electrode. The surface mount circuit element 430 defining the inductor 43L and the line electrode defining the inductor 60 are arranged close to each other. With that configuration, similarly to the above-described case, inductive coupling is generated between the inductor 43L and the inductor 60 as denoted by a thick broken-line arrow in FIG. 10.

Second Structure

Figure 11:
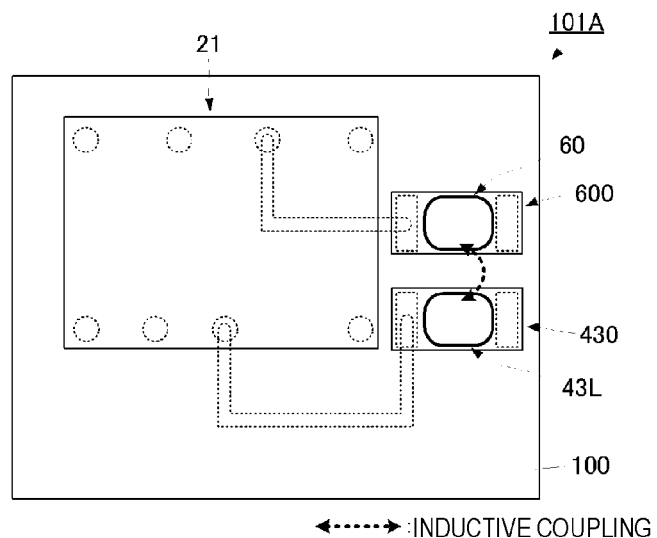
FIG. 11 is a conceptual plan view illustrating a main structure of a second structure of a high-frequency module.

FIG. 11 is a conceptual plan view illustrating a main structure of a high-frequency module. The high-frequency module, denoted by 101A, includes a filter unit 21, a multilayer substrate 100, and two surface mount circuit elements 430 and 600.

The multilayer substrate 100 is formed preferably by laminating a plurality of dielectric layers. Electrodes in predetermined patterns are formed on a top surface (mount surface) 100S and in inner layers of the multilayer substrate 100. The filter unit 21 and the surface mount circuit elements 430 and 600 are mounted to the top surface 100S of the multilayer substrate 100.

The filter unit 21 has the WLP structure described in the above "First Structure". The surface mount circuit element 430 is structured similarly to that described in the above "First Structure". More specifically, the surface mount circuit element 430 includes a rectangular or substantially rectangular parallelepiped casing made of an insulating material, and a spiral electrode that defines and functions as the inductor 43L and that is located inside of the casing. The surface mount circuit element 600 includes a rectangular or substantially rectangular parallelepiped casing made of an insulating material, and a spiral electrode that defines and functions as the inductor 60 and that is located inside of the casing. The other structure of the surface mount circuit element 600 is similar to that of the surface mount circuit element 430.

The filter unit 21 and the surface mount circuit elements 430 and 600 are connected by wiring patterns, which are located on the top surface 100S and in the inner layers of the multilayer substrate 100, so as to obtain the circuit configuration illustrated in FIG. 7.

The surface mount circuit elements 430 and 600 are arranged such that a lengthwise surface of the surface mount circuit element 430 and a lengthwise surface of the surface mount circuit element 600 are positioned close to each other in an opposing relation. With that arrangement, inductive coupling is able to be generated between the inductor 43L defined by the spiral electrode of the surface mount circuit element 430 and the inductor 60 defined by the spiral electrode of the surface mount circuit element 600 as denoted by a thick broken-line arrow in FIG. 11. Thus, a coupling degree between the inductor 43L and the inductor 60 is able to be adjusted by adjusting a distance between the surface mount circuit element 430 and the surface mount circuit element 600, orientations of the surface mount circuit elements 430 and 600, etc. As a result, attenuation characteristics of the high-frequency module 101A are able to be adjusted, and the desired attenuation characteristics are able to be realized with higher accuracy.

FIG. 11 illustrates an example in which the lengthwise surface of the surface mount circuit element 430 and the lengthwise surface of the surface mount circuit element 600 are arranged in an opposing relation. Alternatively, a widthwise surface of the surface mount circuit element 430 (i.e., an end surface thereof where an external connection electrode is located) and the lengthwise surface of the surface mount circuit element 600 may be arranged in an opposing relation. However, stronger inductive coupling is more readily obtained by arranging the lengthwise surface of the surface mount circuit element 430 and the lengthwise surface of the surface mount circuit element 600 to be positioned in an opposing relation.

Furthermore, while FIG. 11 illustrates an example in which the surface mount circuit elements 430 and 600 are each mounted such that a center axis of the spiral electrode intersects perpendicularly or substantially perpendicularly to the top surface 100S of the multilayer substrate 100, the surface mount circuit elements 430 and 600 may be each mounted such that the center axis of the spiral electrode is parallel or substantially parallel to the top surface 100S of the multilayer substrate 100.

Third Structure

Figure 12:
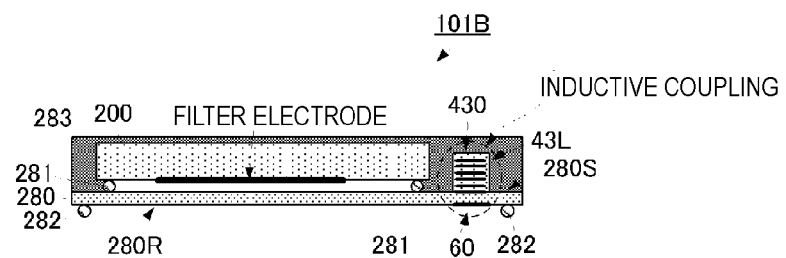
FIG. 12 is a conceptual side view illustrating a main structure of a third structure of a high-frequency module.

FIG. 12 is a conceptual side view illustrating a main structure of a high-frequency module. The high-frequency module, denoted by 101B and illustrated in FIG. 12, is implemented in a so-called CSP (Chip Sized Package) structure.

The high-frequency module 101B includes a filter substrate 200. As in the above-described case, filter electrodes and wiring patterns that define a filter unit 21 are located on a first principal surface of the filter substrate 200.

The high-frequency module 101B further includes a filter mount substrate 280. The filter mount substrate 280 preferably is an alumina substrate, for example, and it has an area larger than that of the filter substrate 200 by a predetermined size when looking at the high-frequency module 101B in a plan view. Electrodes in predetermined patterns are located on the filter mount substrate 280.

The filter substrate 200 is mounted to a top surface (mount surface) 280S of the filter mount substrate 280 with the aid of bump conductors 281 such that the first principal surface of the filter substrate 200 is positioned on the side facing the filter mount substrate 280. A surface mount circuit element 430 defining the inductor 43L is also mounted to the top surface 280S of the filter mount substrate 280. A line electrode defining the inductor 60 and external connection bump conductors 282 are located on a bottom surface 280R of the filter mount substrate 280.

A resin layer 283 is coated over the top surface 280S of the filter mount substrate 280. However, IDT electrodes are not covered with the resin layer 283, and a hollow structure is disposed around the IDT electrodes. As a result, it is possible to prevent the filter electrodes and the wiring patterns from being exposed to external environments, to improve the resonance characteristics of the SAW resonators, and to realize the desired characteristics as a filter with high accuracy.

Here, the spiral electrode defining the inductor 43L and the line electrode defining the inductor 60 are arranged to be at least partly overlapped with each other when looked at in the plan view. Accordingly, as illustrated in FIG. 12, inductive coupling is generated between the inductor 43L and the inductor 60. With the structure of this example, in particular, since the spacing (distance) between the spiral electrode defining the inductor 43L and the line electrode defining the inductor 60 is able to be shortened, stronger inductive coupling is easily obtained.

Furthermore, since the high-frequency module 101B is of the CSP structure in its entirety, the high-frequency module 101B is able to be realized with a smaller size and a reduced thickness.

While, in the above-described examples, the inductor 43L disposed to establish matching with respect to an antenna is defined by the surface mount circuit element 430 that is mounted to the top surface 100S of the multilayer substrate 100, the inductor 43L may be structured as follows.

Fourth Structure

Figure 13:
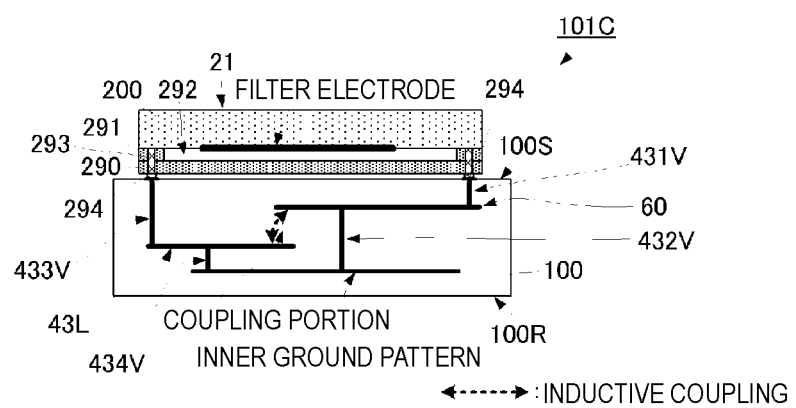
FIG. 13 is a conceptual side view illustrating a main structure of a fourth structure of a high-frequency module.
Figure 14:
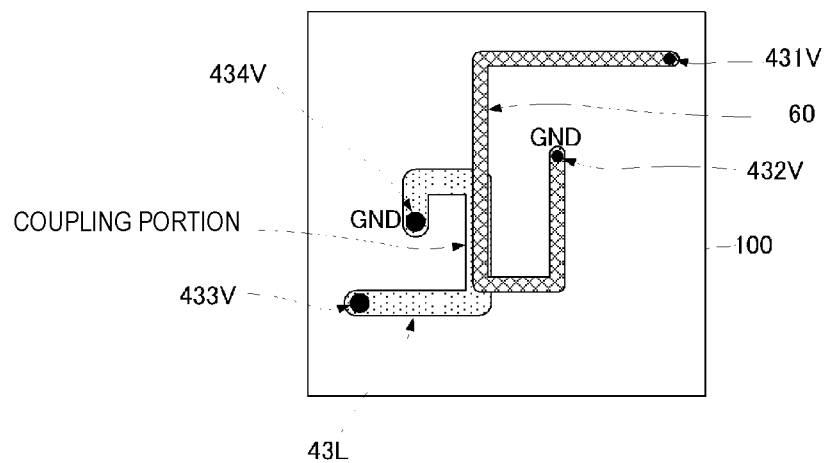
FIG. 14 is a conceptual side view illustrating the main structure of the fourth structure of the high-frequency module.

FIG. 13 is a conceptual side view illustrating a main structure of a high-frequency module. FIG. 14 is a conceptual plan view illustrating the main structure of the high-frequency module. The main structure of the high-frequency module, denoted by 101C and illustrated in FIGS. 13 and 14, is different from the main structure of the high-frequency module 101, illustrated in FIG. 9, in that the inductor 43L is provided inside the multilayer substrate 100, and that the inductor 60 has a different wring pattern. It is to be noted that FIG. 14 is the plan view when looking at the multilayer substrate 100 from the side including the filter unit 21, and that an inner ground pattern is omitted in FIG. 14 for convenience in explanation.

The inductor 43L has a structure including a line electrode inside the multilayer substrate 100 as illustrated in FIGS. 13 and 14. One end of the line electrode defining the inductor 43L is connected, through a via conductor 433V, to a land electrode to which a mount electrode 294 defining and functioning as the first series connection terminal P21' is mounted. The other end of the line electrode defining the inductor 43L is connected, through a via conductor 434V, to the inner ground pattern located inside the multilayer substrate 100.

As illustrated in FIG. 13, the line electrode defining the inductor 43L is provided in a layer different from a layer in which the line electrode defining the inductor 60 is located. As illustrated in the plan view of FIG. 14, the line electrode defining the inductor 43L and the line electrode defining the inductor 60 are arranged such that those inductors extend in a partly overlapping relation. Thus, the inductor 43L and the inductor 60 are arranged close to each other.

With the high-frequency module 101C illustrated in FIGS. 13 and 14, since the inductor 43L and the inductor 60 are arranged close to each other inside the multilayer substrate 100, strong inductive coupling is generated between the inductor 43L and the inductor 60. Furthermore, with the high-frequency module 101C illustrated in FIGS. 13 and 14, since the inductor 43L is located inside the multilayer substrate 100, a mounting area is reduced and a module size is decreased in comparison with that needed in the high-frequency module 101 illustrated in FIG. 9. In addition, since the inductor 43L and the inductor 60L are overlapped with each other in a lamination direction of the multilayer substrate 100, the mounting area is further reduced.

Moreover, as illustrated in FIGS. 13 and 14, the line electrode defining the inductor 43L and the line electrode defining the inductor 60 are arranged such that transfer directions of a high-frequency signal are opposite to each other in a coupling portion between both the inductors. Since the transfer directions are opposite to each other in the coupling portion where the inductive coupling is generated, an effective inductance value of the inductor 60 is increased. As a result, a length of the line electrode defining the inductor 60 is able to be shortened, and the size of the high-frequency module 101C is able to be further reduced.

While the structures for implementing the high-frequency modules have been described above in connection with examples using an inductor as the matching circuit, a high-frequency module using a capacitor as the matching circuit can also be realized with a similar structure. For example, a surface mount multilayer capacitor element may be used instead of the surface mount circuit element 430 including the spiral electrode.

The coupling between the matching circuit and the inductor is able to affect the attenuation characteristics to a larger extent as the number of SAW resonators interposed between the matching circuit and the inductor increases. In the first structure (see FIG. 9), for example, when a positional relation between the line electrode defining the inductor 60 and the surface mount circuit element 430 is the same, an influence upon the attenuation characteristics is increased by coupling the matching circuit and the inductor between which a larger number of SAW resonators are interposed. It is to be noted that the matching circuits 41 to 44 may be each a composite circuit provided by combining a plurality of inductors, a plurality of capacitors, or an inductor and a capacitor.

While the above-described filter unit 20 preferably is a so-called ladder-connected filter, the filter unit may be a longitudinally-coupled resonator filter, for example. In such a case, a high-frequency module having the desired attenuation characteristics is also able to be realized by adjusting inductive coupling or capacitive coupling between the matching circuit and the inductor as described above.

In addition, various preferred embodiments of the present invention are applicable to a high-frequency module using a filter of a so-called bare chip type.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
a first external connection terminal;
a second external connection terminal;
a filter unit connected between the first external connection terminal and the second external connection terminal;
a filter substrate including IDT electrodes that define the filter unit and are located on a first principal surface of the filter substrate;
a cover layer located opposite to the first principal surface of the filter substrate with a spacing defined therebetween;
a connection electrode projecting from the first principal surface and penetrating through the cover layer;
a matching circuit connected between at least one of the first external connection terminal and the second external connection terminal and the filter unit;
a multilayer substrate including the matching circuit mounted thereto or located therein; and
an inductor connected between a ground and the filter unit; wherein
the filter unit includes:
a first series connection terminal connected to the first external connection terminal;
a second series connection terminal connected to the second external connection terminal;
a shunt connection terminal connected to the ground through the inductor;
a plurality of series-connected filter elements connected in series between the first series connection terminal and the second series connection terminal through a plurality of connection lines;
a first shunt-connected filter element including one end connected to a first connection line of the plurality of connection lines, and an opposite end connected to the shunt connection terminal; and
a second shunt-connected filter element including one end connected to a second connection line of the plurality of connection lines, and an opposite end connected to the shunt connection terminal to which the first shunt-connected filter element is connected; wherein
the first principal surface faces a mount surface of the multilayer substrate;
the filter substrate is connected to the multilayer substrate through the connection electrode;
the inductor and the matching circuit are inductively or capacitively coupled to each other;
the matching circuit includes a surface mount circuit element that is mounted to the mount surface of the multilayer substrate;
the inductor is mounted to the mount surface of the multilayer substrate or located inside of the multilayer substrate; and
the surface mount circuit element and the inductor are arranged close to each other.

2. The high-frequency module according to claim 1, wherein the inductor and the matching circuit inductively or capacitively coupled to each other are inductively or capacitively coupled such that impedance outside of a passband of the filter unit is changed.

3. The high-frequency module according to claim 2, wherein the inductor and the matching circuit inductively or capacitively coupled to each other are inductively or capacitively coupled such that a frequency of an attenuation pole outside of the passband of the filter unit is changed.

4. The high-frequency module according to claim 1, wherein the matching circuit is a series-connected matching circuit that is connected in series between the first external connection terminal and the first series connection terminal.

5. The high-frequency module according to claim 1, wherein the matching circuit is a series-connected matching circuit that is connected in series between the second external connection terminal and the second series connection terminal.

6. The high-frequency module according to claim 1, wherein the matching circuit is a shunt-connected matching circuit that is connected between the connection line interconnecting the first external connection terminal and the first series connection terminal and the ground.

7. The high-frequency module according to claim 1, wherein the matching circuit is a shunt-connected matching circuit that is connected between the connection line interconnecting the second external connection terminal and the second series connection terminal and the ground.

8. The high-frequency module according to claim 1, wherein
the filter unit includes a third terminal and a second filter unit; and
the second filter unit is connected between a connection line interconnecting the first series connection terminal and the filter element, which is connected to the first series connection terminal, and the third terminal.

9. The high-frequency module according to claim 1, wherein the matching circuit includes:
a rectangular or substantially rectangular parallelepiped casing; and
a spiral conductor located inside of the casing and having a rectangular or substantially rectangular outer peripheral shape when looking at the high-frequency module in a plan view; wherein
the matching circuit is arranged such that a long side of the casing is close to the inductor.

10. The high-frequency module according to claim 1, wherein the high-frequency module is a duplexer.

11. A high-frequency module comprising:
a first external connection terminal;
a second external connection terminal;
a filter unit connected between the first external connection terminal and the second external connection terminal;
a filter substrate including IDT electrodes that define the filter unit and are located on a first principal surface of the filter substrate;
a cover layer located opposite to the first principal surface of the filter substrate with a spacing defined therebetween;
a connection electrode projecting from the first principal surface and penetrating through the cover layer;
a matching circuit connected between at least one of the first external connection terminal and the second external connection terminal and the filter unit;
a multilayer substrate including the matching circuit mounted thereto or located therein; and
an inductor connected between a ground and the filter unit; wherein
the filter unit includes:
a first series connection terminal connected to the first external connection terminal;
a second series connection terminal connected to the second external connection terminal;
a shunt connection terminal connected to the ground through the inductor;

a plurality of series-connected filter elements connected in series between the first series connection terminal and the second series connection terminal through a plurality of connection lines;
a first shunt-connected filter element including one end connected to a first connection line of the plurality of connection lines, and an opposite end connected to the shunt connection terminal; and
a second shunt-connected filter element including one end connected to a second connection line of the plurality of connection lines, and an opposite end connected to the shunt connection terminal to which the first shunt-connected filter element is connected; wherein
the inductor and the matching circuit are inductively or capacitively coupled to each other;
the first principal surface faces a mount surface of the multilayer substrate;
the filter substrate is connected to the multilayer substrate through the connection electrode;
the matching circuit includes a surface mount circuit element that is mounted to a mount surface of the multilayer substrate;
the inductor is located inside of the cover layer; and
the surface mount circuit element and the inductor are arranged close to each other.

12. A high-frequency module comprising:
a first external connection terminal;
a second external connection terminal;
a filter unit connected between the first external connection terminal and the second external connection terminal;
a filter substrate including IDT electrodes that define the filter unit and are located on a first principal surface of the filter substrate;
a cover layer located opposite to the first principal surface of the filter substrate with a spacing defined therebetween;
a connection electrode projecting from the first principal surface and penetrating through the cover layer;
a matching circuit connected between at least one of the first external connection terminal and the second external connection terminal and the filter unit;
a multilayer substrate including the matching circuit located therein; and
an inductor connected between a ground and the filter unit; wherein
the filter unit includes:
    a first series connection terminal connected to the first external connection terminal;
    a second series connection terminal connected to the second external connection terminal;
    a shunt connection terminal connected to the ground through the inductor;
    a plurality of series-connected filter elements connected in series between the first series connection terminal and the second series connection terminal through a plurality of connection lines;
    a first shunt-connected filter element including one end connected to a first connection line of the plurality of connection lines, and an opposite end connected to the shunt connection terminal; and
    a second shunt-connected filter element including one end connected to a second connection line of the plurality of connection lines, and an opposite end connected to the shunt connection terminal to which the first shunt-connected filter element is connected; wherein
the first principal surface faces a mount surface of the multilayer substrate;
the filter substrate is connected to the multilayer substrate through the connection electrode;
the inductor and the matching circuit are inductively or capacitively coupled to each other;
the matching circuit is a matching inductor connected in parallel to an antenna;
the matching inductor and the inductor are located inside of the multilayer substrate in a state close to each other;
the matching inductor and the inductor are line electrodes located in different layers of the multilayer substrate;
the line electrode defining the matching inductor includes a portion overlapping the line electrode defining the inductor when looking at the multilayer substrate in a lamination direction thereof; and
transfer directions of high-frequency signals propagating through the line electrode defining the matching inductor and through the line electrode defining the inductor are opposite to each other in the overlapping portion.

* * * * *